(12) United States Patent
Sirinorakul et al.

(10) Patent No.: US 6,943,061 B1
(45) Date of Patent: Sep. 13, 2005

(54) METHOD OF FABRICATING SEMICONDUCTOR CHIP PACKAGE USING SCREEN PRINTING OF EPOXY ON WAFER

(75) Inventors: Saravuth Sirinorakul, Bangkok (TH); Thada Suriyanun, Bangkok (TH)

(73) Assignee: NS Electronics Bangkok (1993) Ltd., Bangkok (TH)

( * ) Notice: Subject to any disclaimer, the term of this patent is extended or adjusted under 35 U.S.C. 154(b) by 0 days.

(21) Appl. No.: 10/823,280

(22) Filed: Apr. 12, 2004

(51) Int. Cl.[7] .............................................. H01L 21/44
(52) U.S. Cl. ..................... 438/113; 438/118; 438/126
(58) Field of Search ........................ 438/112, 113, 114, 438/465

(56) References Cited

U.S. PATENT DOCUMENTS

| | | | | |
|---|---|---|---|---|
| 3,789,071 | A * | 1/1974 | Babayan ....................... 564/57 |
| 4,653,175 | A * | 3/1987 | Brueggeman et al. ......... 438/15 |
| 5,208,188 | A * | 5/1993 | Newman ..................... 156/310 |
| 5,776,799 | A * | 7/1998 | Song et al. .................. 438/118 |
| 5,985,376 | A * | 11/1999 | Kamen ....................... 427/504 |
| 6,352,881 | B1 * | 3/2002 | Nguyen et al. ............. 438/108 |
| 6,353,268 | B1 * | 3/2002 | Cobbley et al. ............. 257/796 |
| 6,703,075 | B1 * | 3/2004 | Lin et al. ..................... 427/256 |
| 2002/0062556 | A1 * | 5/2002 | Brouillette et al. ........... 29/832 |
| 2002/0192867 | A1 * | 12/2002 | Nishiyama .................. 438/110 |

\* cited by examiner

*Primary Examiner*—Olik Chaudhuri
*Assistant Examiner*—Lex H. Malsawma
(74) *Attorney, Agent, or Firm*—Silicon Valley Patent Group LLP

(57) ABSTRACT

A layer of nonconductive epoxy is applied to a semiconductor wafer by a screen-printing process before the wafer is separated into individual dice or chips. The epoxy layer is applied as a number of sublayers. Each of the sublayers is cured, except for the final sublayer, which is partially cured. After the epoxy layer has been applied to the wafer, the wafer is separated into individual dice. Each of the dice is then attached to a die pad, a plurality of leads, or another die, using the preformed epoxy layer, by pressing the die against the die pad, leads or die at a selected force and temperature. Applying the epoxy layer to the wafer in the manner described, before dicing, allows it to be made significantly thicker than a conventionally formed epoxy layer. This prevents a leakage current between the die and another element on which the die is mounted.

17 Claims, 10 Drawing Sheets

METHOD OF FABRICATING SEMICONDUCTOR CHIP PACKAGE USING SCREEN PRINTING OF EPOXY ON WAFER

FIELD OF THE INVENTION

This invention relates to the fabrication of packages for semiconductor dice and in particularly to a method of forming an attachment between the semiconductor die and an attach pad.

BACKGROUND OF THE INVENTION

In the fabrication of semiconductor packages, the semiconductor die or chip is frequently attached to an underlying pad, which may be used for electrical and/or thermal purposes. An example is shown in FIGS. 1A and 1B, which is a cross-sectional view and a top view, respectively of a semiconductor chip package 10. FIG. 1A is taken at cross section 1A—1A shown by the dashed line in FIG. 1B. In package 10, a semiconductor die 102 is attached to a die pad 104 by means of a nonconductive epoxy layer 106. Pins 108, 110 and 112 extend from package 10, pins 108 and 100 being separate from die pad 104 and pin 112 being integral with die pad 104. Pads 108a and 110a on the top surface of die 102 are connected to pins 108 and 110 with wires 108b and 110b, respectively. A pad 112a on the top surface of die 102 is connected to die pad 104 with a wire 112b. In this embodiment, pin 108 is connected to a first voltage rail, Vcc, and pin 110 is connected to a second voltage rail, Vdd or ground. Pin 112 is a function pin.

Die pad 104 and pins 108, 110 and 112 are typically plated with silver or a silver alloy.

The lower portion of die 102, which is adjacent to die pad 104, is frequently doped with a P-type impurity (such as boron) or an N-type impurity (such as phosphorus or arsenic) to provide the required electrical circuitry within die 102. Die 102 and die pad 104 are often biased at different electrical potentials. For example, if the lower portion of die 102 is doped with a P-type impurity, die 102 will normally be biased negative with respect to die pad 104. Conversely, if the lower portion of die 102 is doped with an N-type impurity, die 102 will normally be biased positive with respect to die pad 104.

A problem may occur if a leakage current develops between die 102 and die pad 104, for example at a leakage path 114, shown in FIG. 1A. This can happen by electrochemical migration. Leakage path 114 indicates a leakage between the function pin 112 and the voltage on the backside of die 102, which in this example is Vdd or ground. This leakage current is particularly troublesome if the lower portion of die 102 is biased negative with respect to die pad 104. In that event, positively charged silver ions ($Ag^+$) from the plating on die pad 104 tend to migrate to die 102, where they combine with electrons and are deposited as silver metal. The leakage current tends to interfere with the output on pin 112.

This problem is less severe when the lower portion of die 102 is biased positive with respect to die pad 104.

The problem of silver migration could be reduced if the thickness of the nonconductive epoxy layer 106 were increased. This is difficult with the existing technology, however, as will be explained with reference to FIGS. 2A–2E.

FIGS. 2A–2E illustrate a conventional process for forming a semiconductor package, particularly the manner in which the nonconductive epoxy layer is applied. FIG. 2A shows a semiconductor wafer 20 being separated into dice or chips 21 with a dicing saw 22. FIG. 2B shows a liquid nonconductive epoxy layer 23 being applied to the backside of one of dice 21 with a dispensing needle 24. FIG. 2C shows the structure after die 21 has been attached to a die pad 25. FIG. 2D shows the structure after bonding wires 26 have connected pads on the top side of die 21 to points on die pad 25. FIG. 2E shows the completed package after die 21 and bonding wires 26 have been encased in a molding compound 27.

The problem with this process is that the dispensed nonconductive epoxy 23 is in a liquid form. It is very difficult to control the set up of the epoxy so as to produce a thick layer, while preventing the epoxy from bleeding and overflowing the edges of die pad 25, particularly if die 21 is about the same size as die pad 25.

Accordingly, there is a need for a method of reliably providing a thick layer of nonconductive epoxy between the die and die pad to prevent a leakage current between the die and die pad.

SUMMARY OF THE INVENTION

In the process of this invention, a layer of nonconductive epoxy is applied to a semiconductor wafer before it is separated into individual dice or chips. The layer is preferably applied by a screen printing process through a mask, which may be a stencil mask or a polymer fabric mask.

The epoxy layer is normally applied in stages, as a number of sublayers. Each of the sublayers is cured, except for the final sublayer. The final sublayer is partially cured. Alternatively, a single layer may be applied, in which case it is partially cured.

After the epoxy layer has been applied to the wafer, the wafer is separated into individual dice, typically using a dicing saw. Each of the resulting dice has an epoxy layer on one surface thereof, the epoxy layer covering the entire surface of the die and having edges that are essentially coincident with the edges of the die.

Applying the epoxy layer in the manner described to the surface of the wafer before dicing allows it to be made significantly thicker than an epoxy layer applied with a dispensing needle to the individual dice. This prevents a leakage current between the die and another element, such as a die pad or another die, after the die has been mounted thereon. The risk of epoxy overflow around the edges of the die pad is virtually eliminated.

BRIEF DESCRIPTION OF THE DRAWINGS

FIG. 13A is taken at cross section 13A—13A shown in FIG. 13B.

DESCRIPTION OF THE INVENTION

FIGS. 3A–3E provide an overall view of a process according to this invention.

Figure 1A:
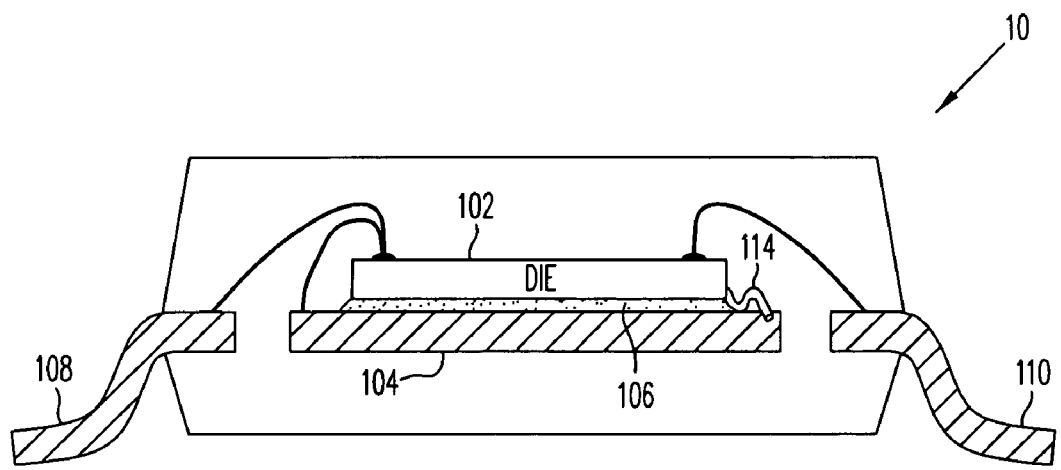
FIG. 1A is a cross-sectional view of a conventional semiconductor die package.
Figure 1B:
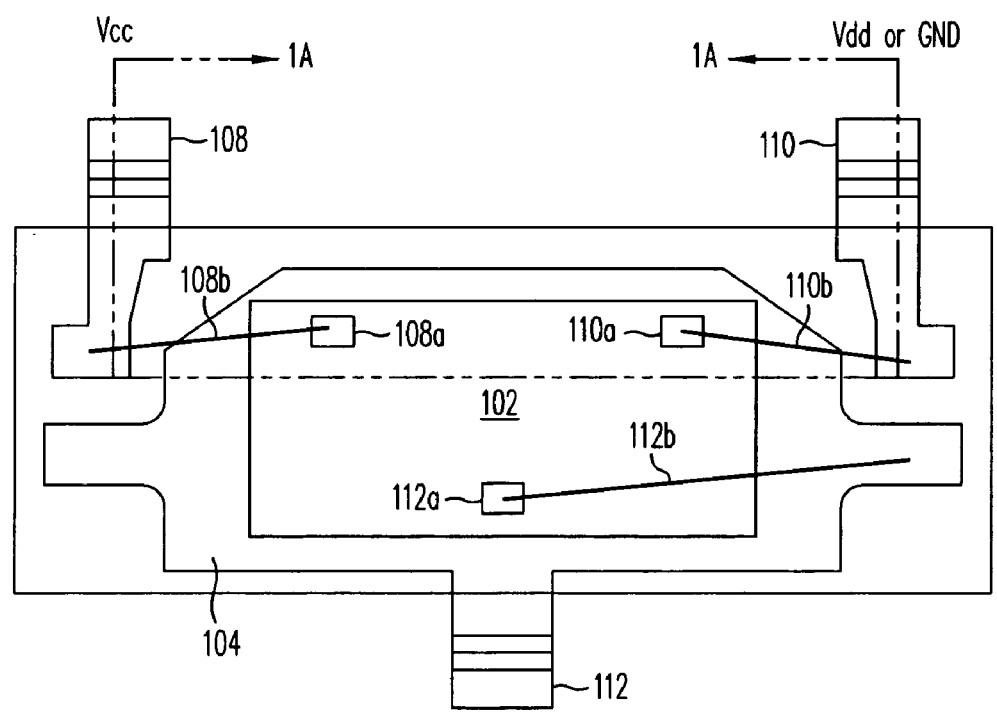
FIG. 1B is a top view of the package shown in FIG. 1A.
Figure 2A:
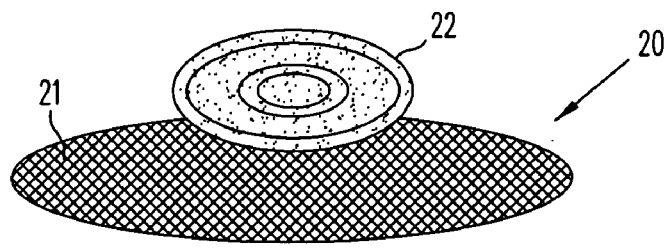
FIGS. 2A–2E illustrate a conventional process of fabricating a semiconductor die package using a dispensing needle to apply a relatively thin layer of nonconductive epoxy to the backside of an individual die.
Figure 2B:
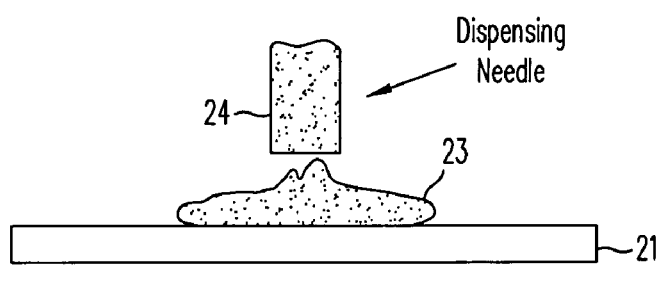
Figure 2C:
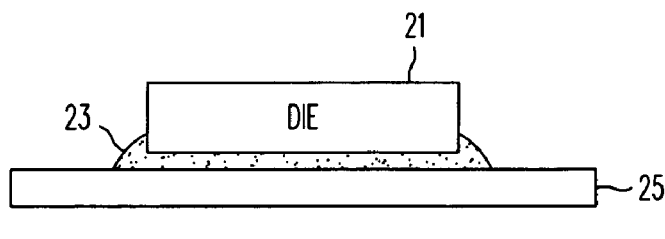
Figure 2D:
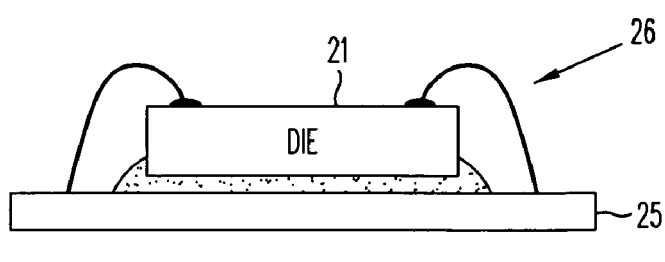
Figure 2E:
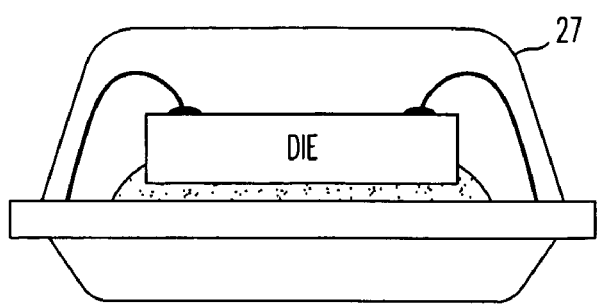
Figure 3A:
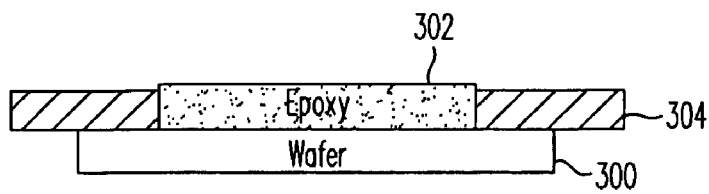
FIGS. 3A–3E illustrate an overall view of a process according to this invention.
Figure 4B:
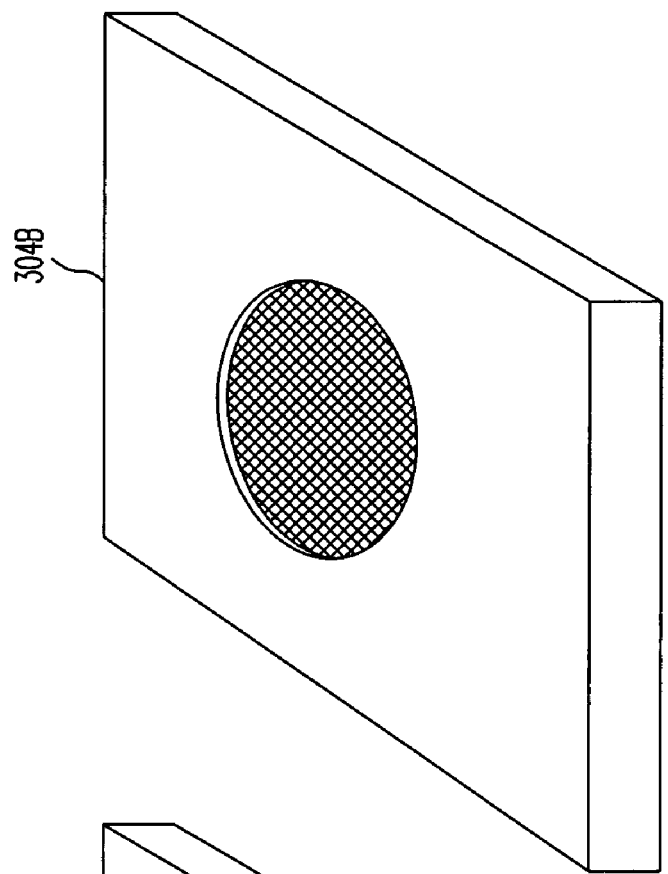
FIGS. 4A and 4B show two forms of mask that can be used in the process.
Figure 4A:
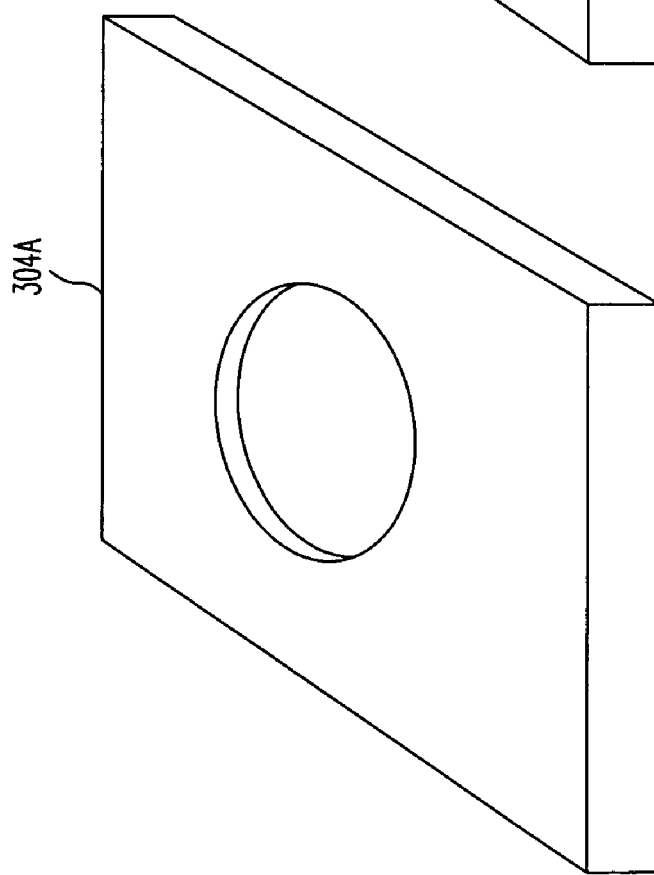

As shown in FIG. 3A, a semiconductor wafer 300 is being screen-printed with a nonconductive epoxy layer 302, using a mask 304. Mask 304 has a circular aperture. FIGS. 4A and 4B show two forms of mask 304: a stencil mask 304A and a polymer fabric mask 304B. A stencil mask is made of metal and has an opening which has a diameter that is slightly less than the diameter of the wafer. The diameter of the opening for a 200 mm wafer would be 195–199 mm; the diameter for a 300 mm wafer would be 295–299 mm. A polymer mask is fabricated like a mat with small (e.g., 2 mm) openings. Stencil and polymer masks are available from Ultracore.

A suitable screen printing machine is available from DEK, model no. 248 or later. The wafer holder on the screen printing machine should provide a high vacuum to hold the wafer flat so that the thickness of epoxy layer 302 will be highly uniform.

Figure 3B:
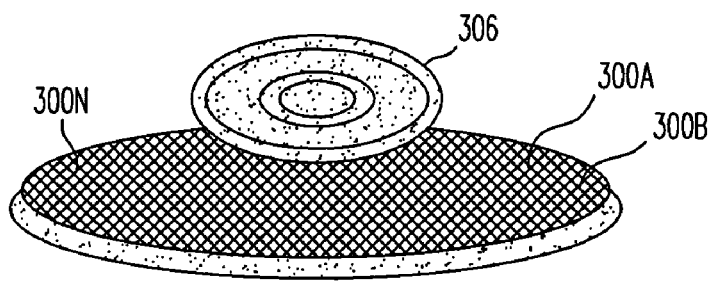

As shown in FIG. 3B, after epoxy layer 302 has been deposited, wafer 300 is sawed into dice 300A, 300B . . . 300N, using a dicing saw 306.

Figure 3C:
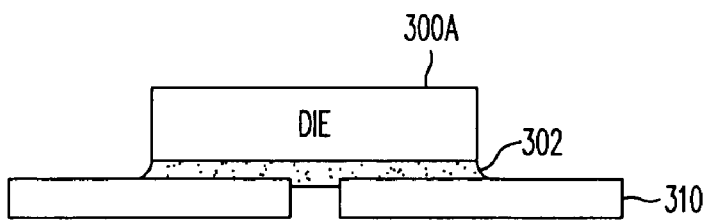
Figure 3D:
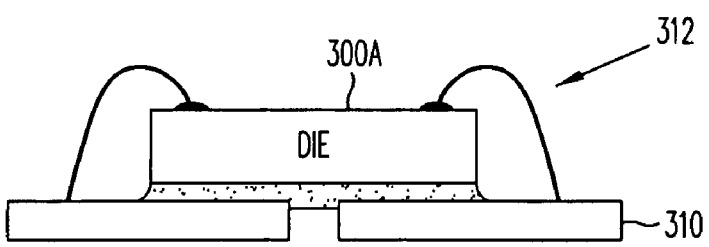
Figure 3E:
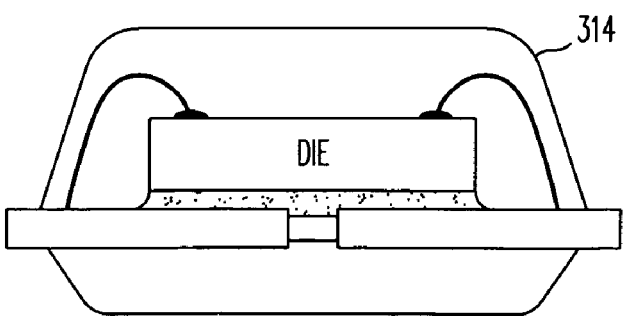

FIG. 3C shows die 300A being attached to a split die pad 310 by means of epoxy layer 302. FIG. 3D shows the structure after bonding wires 312 have connected pads on the top side of die 300A to points on die pad 310. FIG. 3E shows the completed package after die 300A and bonding wires 312 have been encased in a molding compound 314.

FIGS. 5A–5E show in detail how the epoxy layer 302 is applied to wafer 300.

Figure 5A:
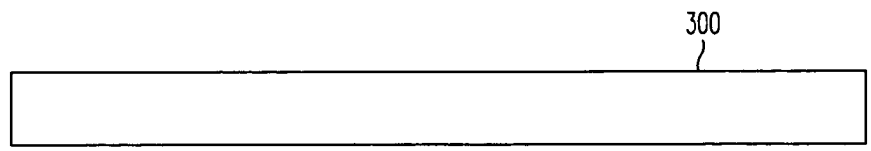
FIGS. 5A–5E show in detail how the epoxy layer is applied to the wafer.

FIG. 5A shows the incoming wafer 300.

Figure 5B:
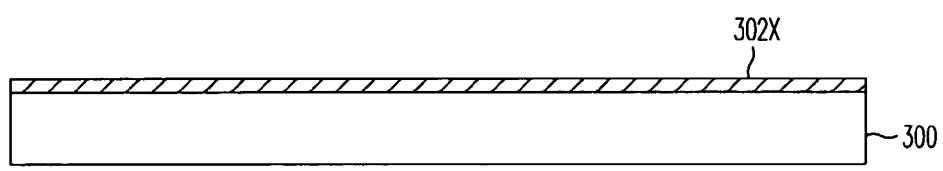

In FIG. 5B, a first epoxy sublayer 302X is applied to wafer 300 through a mask (not shown). Epoxy sublayer 302X may be 15–35 microns thick, for example. A suitable epoxy may be obtained from Ablestik or Sumitomo. Sublayer 302A is subjected to a "hard" cure by heating it to 175° C. for 30 minutes, for example.

Figure 5C:
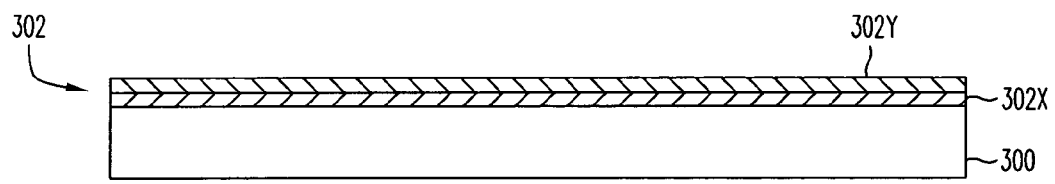

In FIG. 5C, a second epoxy sublayer 302Y has been deposited on top of sublayer 302X through the mask. Epoxy sublayer 302Y may be 15–35 microns thick, for example. Epoxy sublayer 302Y is subjected to a "B stage" (partial) cure by heating it to 100° C. for 60 minutes, for example.

Following the B-stage cure, sublayer 302Y is in a soft but solid form for further application.

The combination of epoxy sublayers 302X and 302Y yields epoxy layer 302.

Figure 5D:
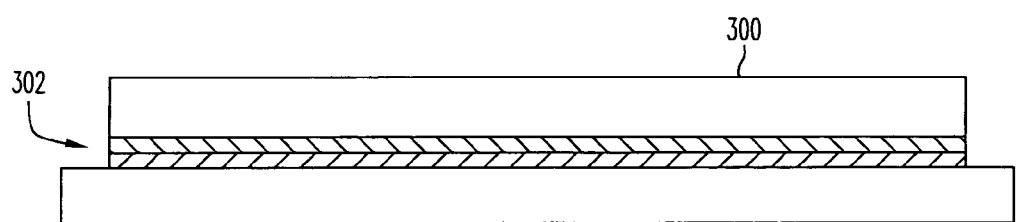

As shown in FIG. 5D, wafer 300 is mounted on a standard sawing tape 316, with epoxy layer 300 in contact with sawing tape 316. Any quality sawing tape (such as those available from Mitsui and Nitto) is acceptable.

Figure 5E:
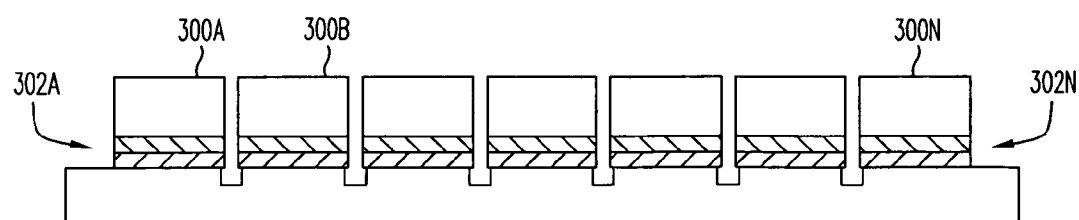

As shown in FIG. 5E, the assembly of wafer 300 and epoxy layer 302 is then diced (separated) into individual dice or chips, using dicing saw 306. This yields dice 300A, 300B . . . 300N, each of which has a corresponding section 302A, 302B . . . 302N of epoxy layer 302 attached to one surface thereof. The section of epoxy layer 302 that is attached to each of dice 300A . . . 300N, completely covers the surface thereof. The edges of the sections 302A, 302B . . . 302N coincide with the edges of dice 300A, 300B . . . 300N.

Figure 6A:
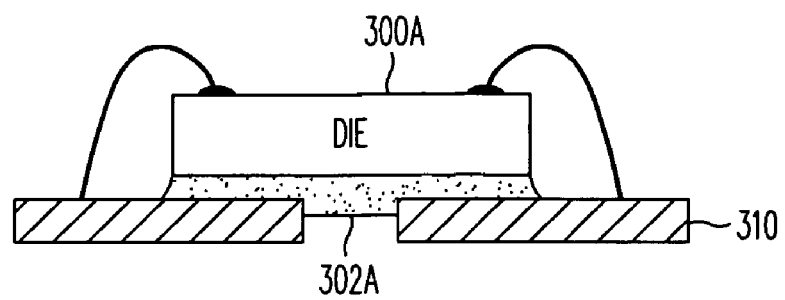
FIGS. 6A and 6B show how a die produced by the process of FIGS. 5A–5E is mounted on a die pad.
Figure 6B:
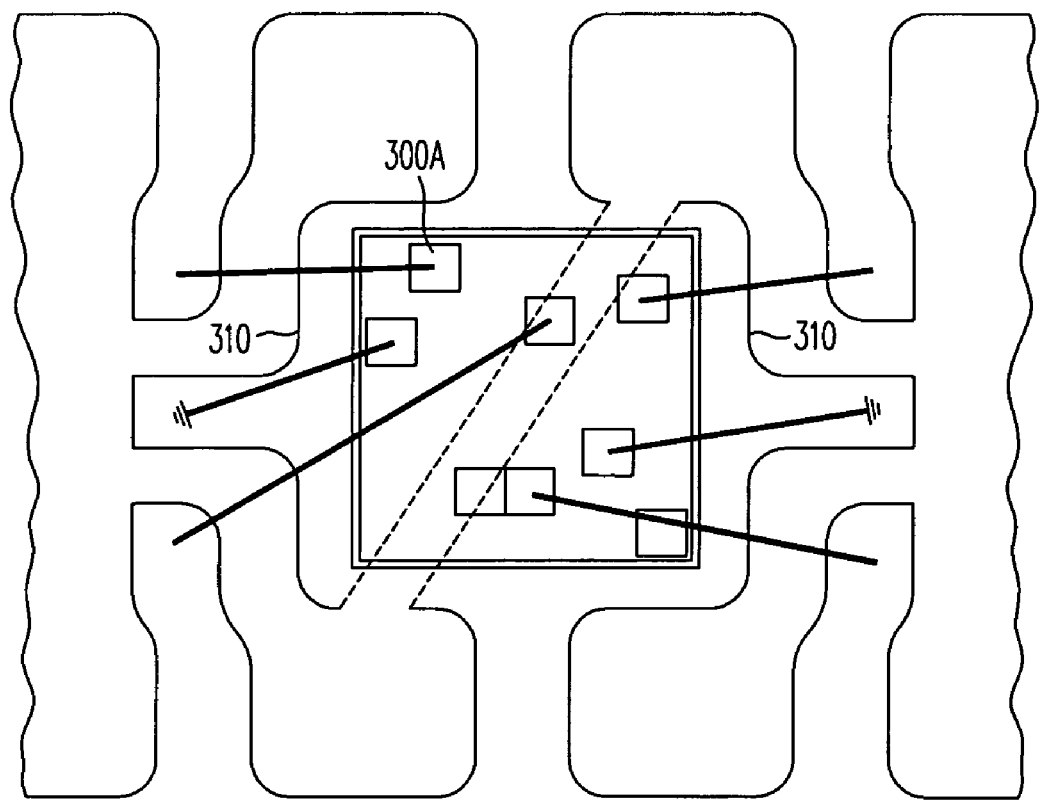

FIGS. 6A and 6B show cross-sectional and top views, respectively, of die 300A attached to split die pad 310 with epoxy layer section 302A. Die 300A is attached to die pad 310 by placing a heating block underneath die pad 310 and heating the assembly to 110–170° C. for 50–400 seconds, while pressing die pad 310 and die 300A together with a bonding force of 100–350 grams. The temperature depends on the size of the leadframe. The time depends on the size of the die. For example, for a SOT23/SC70 leadframe and a 40 mil×40 mil die, the process may be performed at 150–160° C. for 100–200 seconds. For a SOT23/SC70 leadframe and a 100 mil×100 mil die, the process may be performed at 150–160° C. for 120–200 seconds. For chip on lead DFN leadframe and a 30 mil×40 mil die, the process may be performed at 110–130° C. for 100–200 seconds.

Because epoxy layer 302 can be made thicker than conventional epoxy layers, the risk of a leakage current between 300A and die pad 310 is greatly reduced. The thickness of epoxy layer 302 can be varied by varying the number of "hard cured" layers that are deposited before the partially-cured (stage-B) layer is deposited. That is to say, two, three or more hard cured epoxy layers may be deposited under the partially cured layer. The thickness may also be varied by varying the thickness of the individual layers. Normally, not more than three layers are applied, and frequently the thickness of the first and second layers are increased rather than applying a third layer.

Packages fabricated according to this invention can take a wide variety for forms. FIGS. 7–12 illustrate some of the possibilities.

Figure 7:
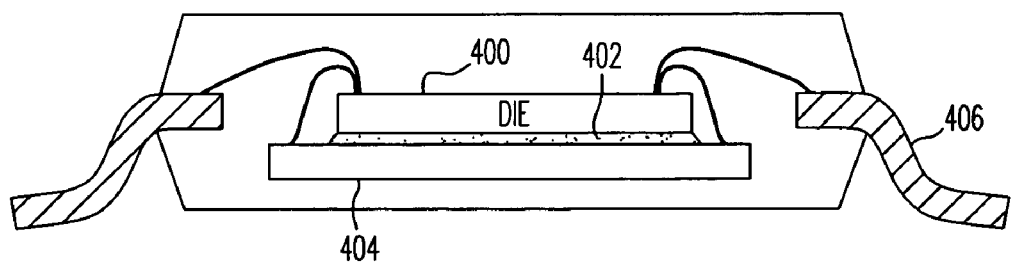
FIG. 7 is a cross-sectional view of a Small Outline Integrated Circuit (SOIC), Shrink Small Outline Package (SSOP), Thin Shrink Small Outline Package (TSSOP), Small Outline Transistor (SOT) or Thin Small Outline Transistor (TSOT) package containing a nonconductive epoxy layer in accordance with this invention.

FIG. 7 shows an SOIC, SSOP, TSSOP, SOT or TSOT package in which a die 400 is mounted via an epoxy layer 402 formed in accordance with this invention on a die pad 404. Pads on the surface of die 400 are wire-bonded to leads 406 and die pad 404.

Figure 8:
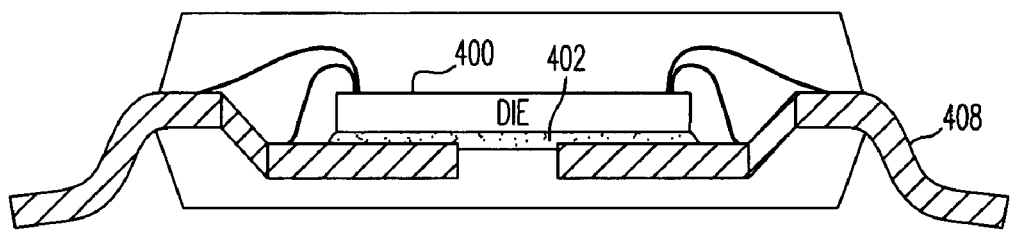
FIG. 8 is a cross-sectional view of an alternative form of SOIC, SSOP, TSSOP, SOT or TSOT package containing a nonconductive epoxy layer in accordance with this invention, in which there is no die pad and the die is mounted on the leads.

FIG. 8 shows an SOIC, SSOP, TSSOP, SOT or TSOT package in which die 400 is mounted via epoxy layer 402 directly on leads 408.

Figure 9:
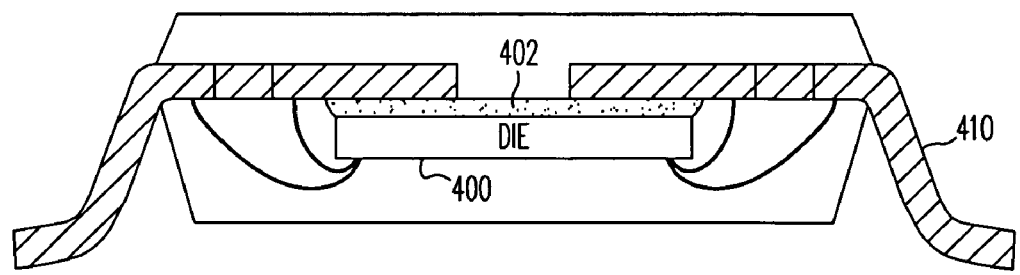
FIG. 9 is a cross-sectional view of another alternative form of TSSOP, SOT, TSOT or Single Chip 70 (SC70) package containing a nonconductive epoxy layer in accordance with this invention, in which there is no die pad and the die is mounted underneath the leads.

FIG. 9 shows a TSSOP, SOT, TSOT or SC70 package in which die 400 is mounted via epoxy layer 402 underneath leads 408.

Figure 10:
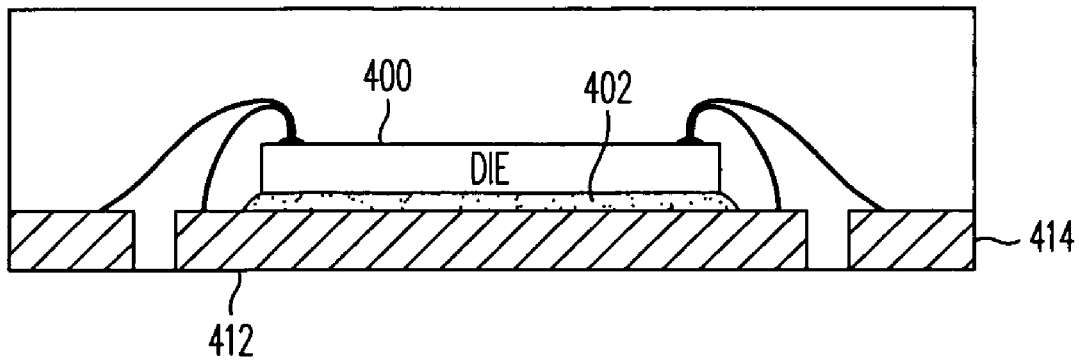
FIG. 10 is a cross-sectional view of a Quad Flat No-Lead (QFN) or Dual Flat No-Lead (DFN) package containing a nonconductive epoxy layer in accordance with this invention.

FIG. 10 shows a QFN or DFN package in which die 400 is mounted via epoxy layer 402 on a die pad 412. Pads on the surface of die 400 are wire-bonded to contacts 414 and die pad 412.

Figure 11:
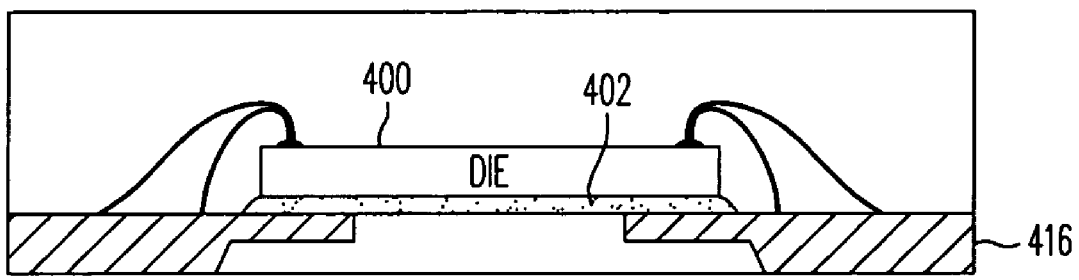
FIG. 11 is a cross-sectional view of an alternative form of QFN or DFN package containing a nonconductive epoxy layer in accordance with this invention, in which there is no die pad and the die is mounted on the contacts.

FIG. 11 shows a QFN or DFN package in which die 400 is mounted via epoxy layer 402 directly on contacts 416.

Figure 12:
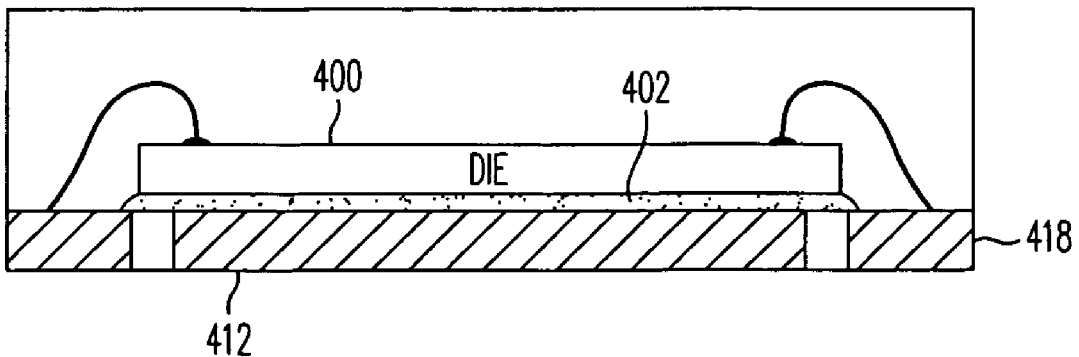
FIG. 12 is a cross-sectional view of another alternative form of QFN or DFN package containing a nonconductive epoxy layer in accordance with this invention, in which the die is mounted on the contacts.

FIG. 12 shows a QFN or DFN package in which die 400 is mounted via epoxy layer 402 on die pad 412 and contacts 418.

Figure 13A:
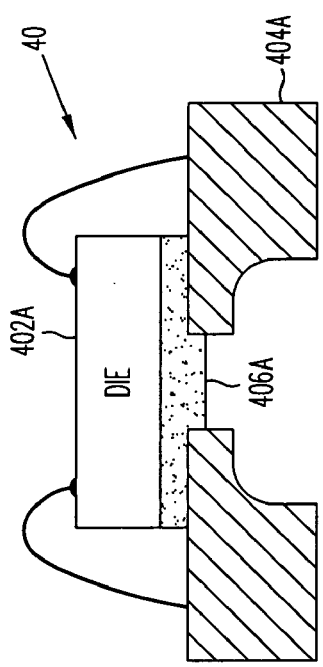
FIGS. 13A and 13B illustrate cross-sectional and top views, respectively, of a "chip-on-lead" package containing a nonconductive epoxy layer in accordance with this invention.
Figure 13B:
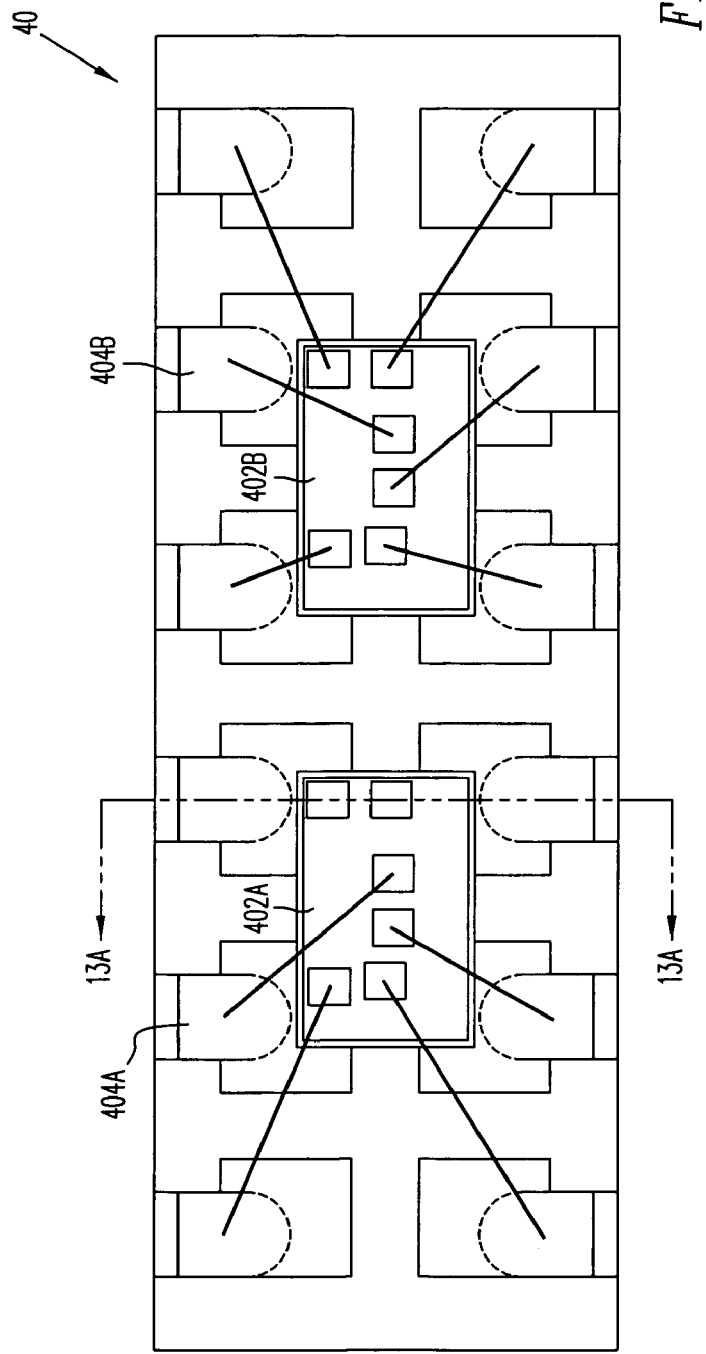

FIGS. 13A and 13B illustrate cross-sectional and top views, respectively, of a "chip-on-lead" package 40 wherein dice 402A and 402B are mounted on six-lead frames 404A and 404B. The bottom surfaces of dice 402A and 402B are effectively insulated from lead frames 404A and 404B by means of epoxy layers 406A and 406B that are formed on the bottom surfaces of dice 402A and 402B by a process according to this invention. Package 40 could measure 3 mm×1 mm, for example.

Figure 14:
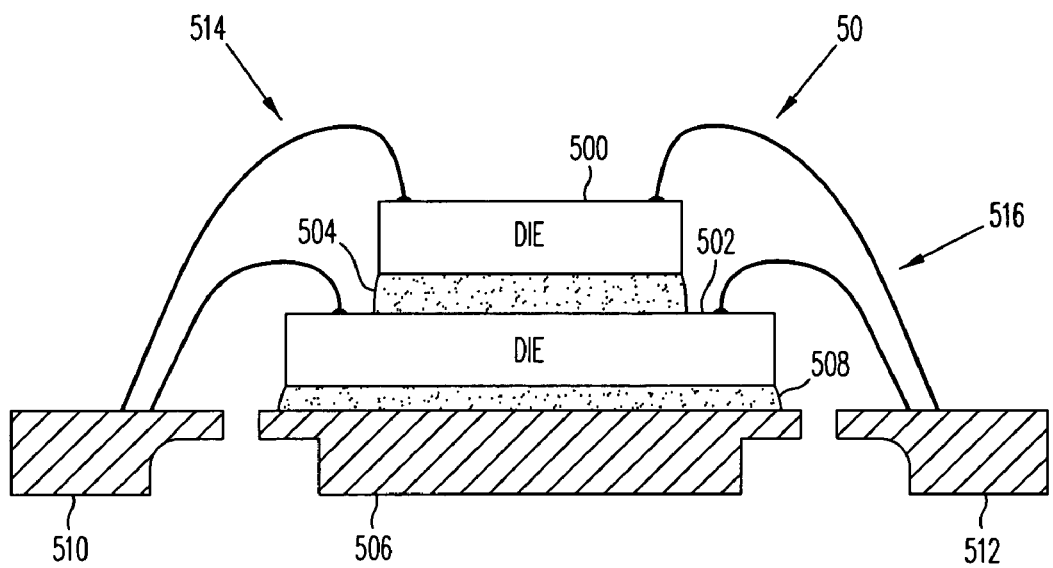
FIG. 14 is a cross-sectional view of a flat no-lead package that contains dice stacked on one another.
Figure 15:
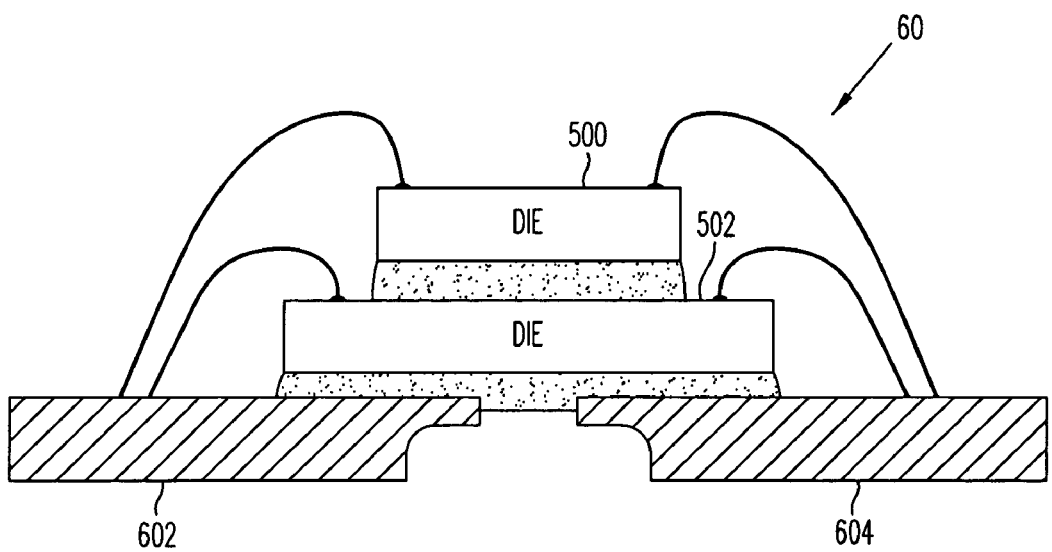
FIG. 15 is a cross-sectional view of a chip-on-lead package that contains dice stacked on one another.

FIGS. 14 and 15 are cross-sectional views of packages 50 and 60, which contain dice stacked on one another.

In FIG. 14 a die 500 is stacked on a die 502 by means of a nonconductive epoxy layer 504. Die 502 is mounted on a die pad 506 by means of a nonconductive epoxy layer 508. Dice 500 and 502 are wire-bonded to leads 510 and 512 by means of bonding wires 514 and 516. Both of the epoxy layers 504 and 508 are formed in accordance with this invention so as to prevent leakage currents between dice 500 and 502 and between die 502 and die pad 506.

FIG. 15 shows a chip on lead package 60. Package 60 contains a similar stack of dice 500 and 502 on leads 602 and 604, which are part of a lead frame.

While specific embodiments according to this invention have been described herein, it will be understood by those skilled in the art that these embodiments are illustrative only, and not limiting. Many alternative embodiment in accordance with the principles of this invention will be obvious from the above description to those of skill in the art.

What is claimed is:

1. A method of fabricating a semiconductor chip package comprising:
   providing a semiconductor wafer, said semiconductor wafer having a top surface and a bottom surface, a plurality of bonding pads being located on said top surface;
   applying at least one nonconductive epoxy sublayer to a said bottom surface of said semiconductor wafer using a screen printing process;
   completely curing said at least one nonconductive epoxy sublayer;
   applying a final nonconductive epoxy sublayer on top of said at least one epoxy sublayer, said at least one nonconductive epoxy sublayer and said final nonconductive epoxy sublayer together forming a nonconductive epoxy layer;
   partially curing said final nonconductive epoxy sublayer such that said final epoxy sublayer is in a soft but solid form;
   while said final nonconductive epoxy sublayer is still only partially cured, sawing said wafer to create a plurality of semiconductor dice, said nonconductive epoxy layer completely covering a bottom surface of each of said semiconductor dice; and
   attaching at least one of said semiconductor dice to a die-attach member by means of said nonconductive epoxy layer.

2. The method of claim 1 further comprising wire-bonding said die-attach member to at least one of said bonding pads.

3. The method of claim 1 wherein said die-attach member comprises a pad.

4. The method of claim 1 wherein said die-attach member comprises a leadframe.

5. The method of claim 1 wherein partially curing said final nonconductive epoxy sublayer comprises heating said final epoxy sublayer until it is in a soft solid state.

6. The method of claim 5 wherein partially curing said final nonconductive epoxy sublayer comprises heating said final epoxy sublayer to a temperature in the range of 100° C. for a duration of 60 seconds.

7. The method of claim 5 wherein attaching at least one of said dice to a die-attach member comprises heating said final nonconductive epoxy sublayer.

8. The method of claim 7 wherein attaching at least one of said dice to a die-attach member comprises heating said final nonconductive epoxy sublayer to a temperature in the range of 110° C. to 170° C. for a duration of 50 to 400 seconds.

9. The method of claim 1 wherein applying at least one nonconductive epoxy sublayer comprises applying only one epoxy sublayer.

10. The method of claim 1 wherein said die-attach member comprises a split die-attach pad.

11. The method of claim 1 wherein said die-attach member comprises a plurality of contacts for a no-lead package.

12. The method of claim 11 comprising wire-bonding at least one of said contacts for a no-lead package to at least one of said bonding pads.

13. The method of claim 1 further comprising
   providing a second semiconductor wafer, said second semiconductor wafer having a top surface and a bottom surface, a plurality of bonding pads being located on said top surface of said second semiconductor wafer;
   applying at least one nonconductive adhesive sublayer to said bottom surface of said second semiconductor wafer using a screen printing process;
   curing said at least one nonconductive adhesive sublayer;
   applying a final nonconductive adhesive sublayer on top of said at least one adhesive sublayer, said at least one nonconductive adhesive sublayer and said final nonconductive adhesive sublayer together forming a nonconductive adhesive layer;
   partially curing said final nonconductive adhesive sublayer such that said final nonconductive adhesive sublayer is in a soft but solid form;
   while said final nonconductive adhesive sublayer is still only partially cured, sawing said second semiconductor wafer to create a second plurality of semiconductor dice, said nonconductive adhesive layer completely covering a bottom surface of each of said second plurality of semiconductor dice; and
   attaching at least one of said second plurality of semiconductor dice to one of said plurality of semiconductor dice by means of said nonconductive adhesive layer.

14. The method of claim 1 comprising attaching a sawing tape to said epoxy layer before sawing said semiconductor wafer.

15. The method of claim 14 wherein sawing said semiconductor wafer comprises sawing said semiconductor wafer from said top surface of said wafer, said sawing creating a cut that extends partially through said sawing tape.

16. A method of fabricating a semiconductor chip package comprising:

providing a semiconductor wafer;

depositing in succession a plurality of nonconductive epoxy layers on a first surface of said wafer, said plurality of nonconductive epoxy layers comprising a top epoxy layer;

completely curing each of said epoxy layers except for said top epoxy layer;

partially curing said top epoxy layer;

sawing said wafer into a plurality of dice, a first surface of each of said dice being completely covered by said nonconductive epoxy layers;

pressing the top epoxy layer on one of said dice against a pad or leadframe; and applying heat to said pad or leadframe to completely cure said top epoxy layer on said one of said dice.

17. The method of claim 16 wherein pressing the top epoxy layer on one of said dice against a pad or leadframe and applying heat to said pad or leadframe to completely cure said top epoxy layer on said one of said dice comprises pressing the top epoxy layer on said one of said dice against a pad or leadframe with a force in the range of 100 to 350 grams while heating said pad or leadframe to a temperature in the range of 110° C. to 170° C. for a duration of 50 to 400 seconds.

* * * * *